(12) United States Patent
Chen et al.

(10) Patent No.: US 8,466,732 B2
(45) Date of Patent: Jun. 18, 2013

(54) VOLTAGE LEVEL SHIFTER

(75) Inventors: Po-Hung Chen, Taipei (TW); Kuoyuan (Peter) Hsu, San Jose, CA (US); David Yen, Chu-Bak (TW); Sung-Chieh Lin, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 85 days.

(21) Appl. No.: 12/900,650

(22) Filed: Oct. 8, 2010

(65) Prior Publication Data

US 2012/0086495 A1    Apr. 12, 2012

(51) Int. Cl.
*H03L 5/00* (2006.01)

(52) U.S. Cl.
USPC .......................................................... 327/333

(58) Field of Classification Search
None
See application file for complete search history.

(56) References Cited

U.S. PATENT DOCUMENTS

| | | | |
|---|---|---|---|
| 5,436,585 A * | 7/1995 | DiMarco | 327/333 |
| 6,940,333 B2 * | 9/2005 | Chiu et al. | 327/333 |
| 7,782,113 B2 * | 8/2010 | Lin | 327/333 |

FOREIGN PATENT DOCUMENTS

CN    1231547    10/1999

OTHER PUBLICATIONS

Office Action dated Mar. 5, 2013 from corresponding application No. CN 201110241604.1.

* cited by examiner

*Primary Examiner* — Lincoln Donovan
*Assistant Examiner* — Khareem E Almo
(74) *Attorney, Agent, or Firm* — Lowe Hauptman Ham & Berner, LLP

(57) ABSTRACT

An input of a first inverter is configured to serve as an input node. An output of the first inverter is coupled to an input of a second inverter. An output of the second inverter is configured to serve as an output node. An input of a third inverter is coupled to an input of the first inverter. A gate of a first NMOS transistor is coupled to an output of the third inverter. A drain of the first NMOS transistor is coupled to the second inverter. A source of the first NMOS transistor is configured to serve as a level input node. When the input node is configured to receive a low logic level, the output node is configured to receive a voltage level provided by a voltage level at the level input node.

21 Claims, 5 Drawing Sheets

VOLTAGE LEVEL SHIFTER

FIELD

The present disclosure is related to a voltage level shifter.

BACKGROUND

Ground, or a ground node, in integrated circuits is the reference point for other voltages to be measured. Generally, the voltage level at a ground node is 0 volts (V). Many circuits, however, have more than one ground domain or ground node wherein, for example, a first sub-circuit uses a first ground node while a second sub-circuit uses a second ground node, and the voltage level at the two ground nodes is different from one another. Similarly, a circuit may have more than one power domain having more than one power supply source providing more than one supply voltage.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
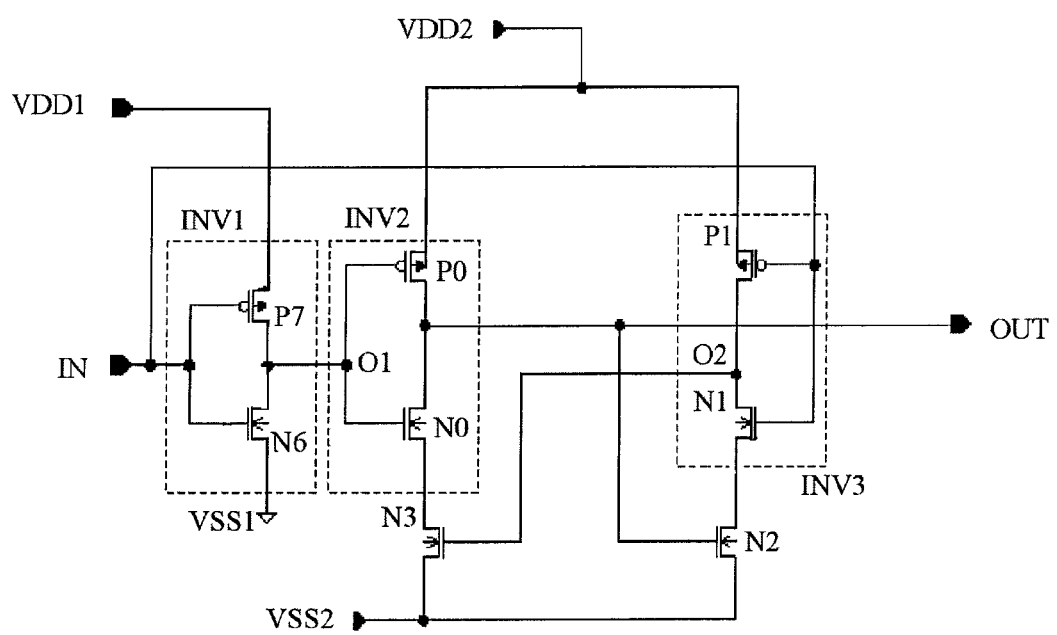
FIG. 1 is a diagram of a voltage level shifter, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Exemplary Circuit

FIG. 1 is a diagram of a voltage level shifting circuit (e.g., a voltage level shifter) 100, in accordance with some embodiments. When input IN is applied with a low logic level (e.g., a Low), output OUT follows the voltage level specified at node VSS2 (e.g., the ground reference input level node). When input IN is applied with a high logic level (e.g., a High), however, output OUT follows the voltage specified at node VDD2 (e.g., the power supply input level node). Stated another way, voltage level shifter 100 shifts the ground level in a first ground domain having voltage VSS1 as ground to a second ground domain having voltage VSS2 as ground. Similarly, voltage level shifter 100 shifts the supply level in a first power domain (e.g., power supply domain) having voltage VDD1 as an operational voltage to a second power domain having voltage VDD2 as an operational voltage.

For example, in some circuits in a first ground domain, the Low has a voltage value of voltage VSS1 (e.g., 0 V) while in some other circuits in a second ground domain, the Low has a voltage value of voltage VSS2 (e.g., −0.5 V). Similarly, in some circuits in a first power domain, the High has a voltage value of voltage VDD1 (e.g., 0.85 V) while in some other circuits in a second power domain, the High has a voltage level of voltage VDD2 (e.g., 0.95 V). In FIG. 1, inverter INV1 is in both the first ground domain and the first power domain because, when input IN is Low, output O1 is High at the voltage value of voltage VDD1. But when input IN is High, output O1 is Low at the voltage value of voltage VSS1. For a further example, inverter INV2 is in both the second ground domain and the second power domain because when output OUT is Low, the Low voltage value is from voltage VSS2, but when output OUT is High, the High voltage value is from voltage VDD2. Even though voltage level shifter 100 can shift both the ground level of voltage VSS1 and the power supply level of voltage VDD1, shifting either the ground level or the power supply level is within the scope of various embodiments. For example, to shift the ground level only, voltage VDD2 is set at voltage VDD1 or both nodes of voltage VDD1 and VDD2 are coupled together. Similarly, to shift the power supply level only, voltage VSS2 is set at voltage VSS1 or nodes of voltage VSS1 and VSS2 are coupled together.

PMOS transistor P7 and NMOS transistor N6 are coupled in series (e.g., the drain of PMOS transistor P7 is coupled to the drain of NMOS transistor N6) and form inverter INV1. Output O1 of inverter INV1 serves as the input for inverter INV2 constituted by PMOS transistor P0 and NMOS transistor N0 coupled in series (e.g., the drain of PMOS transistor P0 is coupled to the drain of NMOS transistor N0). The output of inverter INV2 serves as output OUT for level shifter 100, which also controls (e.g., turns on/off) NMOS transistor N2. For example, when output OUT is High, the gate of transistor N2 is High, which turns on transistor N2. When output OUT, however, is Low, the gate of transistor N2 is Low, which turns off transistor N2.

NMOS transistors N0 and N3 are coupled in series (e.g., the source of NMOS transistor is coupled to the drain of NMOS transistor N3). When input IN is low, transistor N3 together with transistor N0 pulls the voltage level at output OUT, which is the drain of transistor N0, to the voltage level at node VSS2, which is the source of transistor N3.

Transistor P0, when input IN is High), pulls the voltage level at output OUT, which is the drain of transistor P0, to the voltage level at the source of transistor P0, which is voltage VDD2.

PMOS transistor P1 and NMOS transistor N1 are coupled in series (the drain of PMOS transistor P1 is coupled to the drain of NMOS transistor N1), and form inverter INV3. Node O2, the output of inverter INV3, controls (e.g., turns on/off) transistor N3. For example, when output O2 is High, the gate of NMOS transistor N3 is High, which turns on transistor N3. But if output O2 is Low, the gate of NMOS transistor N3 is Low, which turns off transistor N3.

In some embodiments, $$VDD1 > Vtn1 + VSS1 \text{ and } VDD2 > Vtn2 + VSS2 \text{ and}$$

$$VDD1 > Vtn2 + VSS2 \text{ and } VDD1 > VDD2 - |Vtp2|$$

Wherein voltage Vtn1 is the threshold voltage of NMOS transistor N6, and voltage Vtn2 is the threshold voltage of NMOS transistors N0, N1, N2, and N3. Voltage Vtp2 is the threshold voltage of transistors P0 and P1.

In the above illustration, when VDD1>Vtn1+VSS1, transistor N6 has sufficient power supply to be on. When VDD2>Vtn2+VSS2 transistors N2 and N3 have sufficient power supply to be on. When VDD1>Vtn2+VSS2, transistors N0 and N1 have sufficient power supply be on, and when VDD1>VDD2−|Vtp2|, transistors P0 and P1 have sufficient power to be off. In some embodiments, voltages VSS1 and VSS2 are in the range from about −0.5 V to about 0.3, but different ranges are within the scope of various embodiments.

Exemplary Operation with the Input Receiving a Low Logic Level

Figure 2:
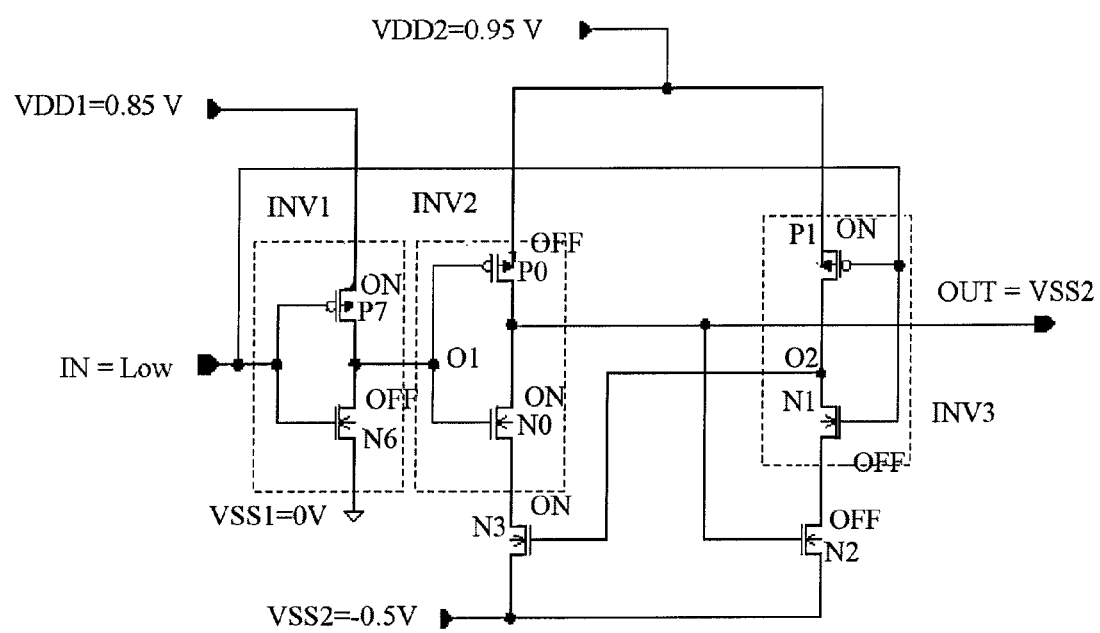
FIG. 2 is a diagram of the voltage level shifter in FIG. 1 having the operational state of each transistor labeled when the input of the voltage level shifter receives a low logic level, in accordance with some embodiments.

FIG. 2 is a diagram 200 of voltage level shifter 100 having the operational state of each transistor labeled, illustrating an operation of voltage level shifter 100 when a Low is applied to input IN, in accordance with some embodiments. As illustratively shown, transistors N6, P0, N1, and N2 are off while transistors P7, N0, N3, and P1 are on. Further, voltages VSS1, VDD1, VSS2, and VDD2 are set at 0.0 V, 0.85 V, and −0.5 V, and 0.95 V, respectively. In some embodiments, when input IN is Low, the voltage level of output OUT follows the voltage level specified at node VSS2, which, for illustration, is −0.5 V.

Because input IN is Low, NMOS transistor N6 is off while PMOS transistor P7 is on. Node O1, which is the drain of PMOS transistor P7 is pulled to the voltage level at the source of PMOS transistor P7, which is High at the voltage value of voltage VDD1 (e.g., 0.85V). Stated another way, because input IN of inverter INV1 is Low, output O1, the output of inverter INV1, is High, which also turns off PMOS transistor P0, and turns on NMOS transistor N0. Because transistor P0 is off, output OUT is electrically disconnected from voltage VDD2.

Because input IN is Low, the gates of PMOS transistor P1 and NMOS transistor N1 are Low. As a result, transistor P1 and N1 are on and off, respectively. Because transistor P1 is on, node O2, which is the drain of transistor P1, is pulled to the voltage level at its source, which is voltage VDD2. Because node O2 is also the gate of transistor N3, which is at voltage VDD2, transistor N3 turns on.

Because NMOS transistor N0 is on, the voltage level at the drain of transistor N0 is pulled to the source of transistor N0, which is the drain of transistor N3. Because transistor N3 is on, it pulls the voltage level at its drain to the voltage level at its source, which is voltage VSS2 or −0.5 V. Stated differently, the voltage level at output OUT is pulled to (or follows) the voltage level at node VSS2, which is illustratively shown at −0.5 V.

Figure 3:
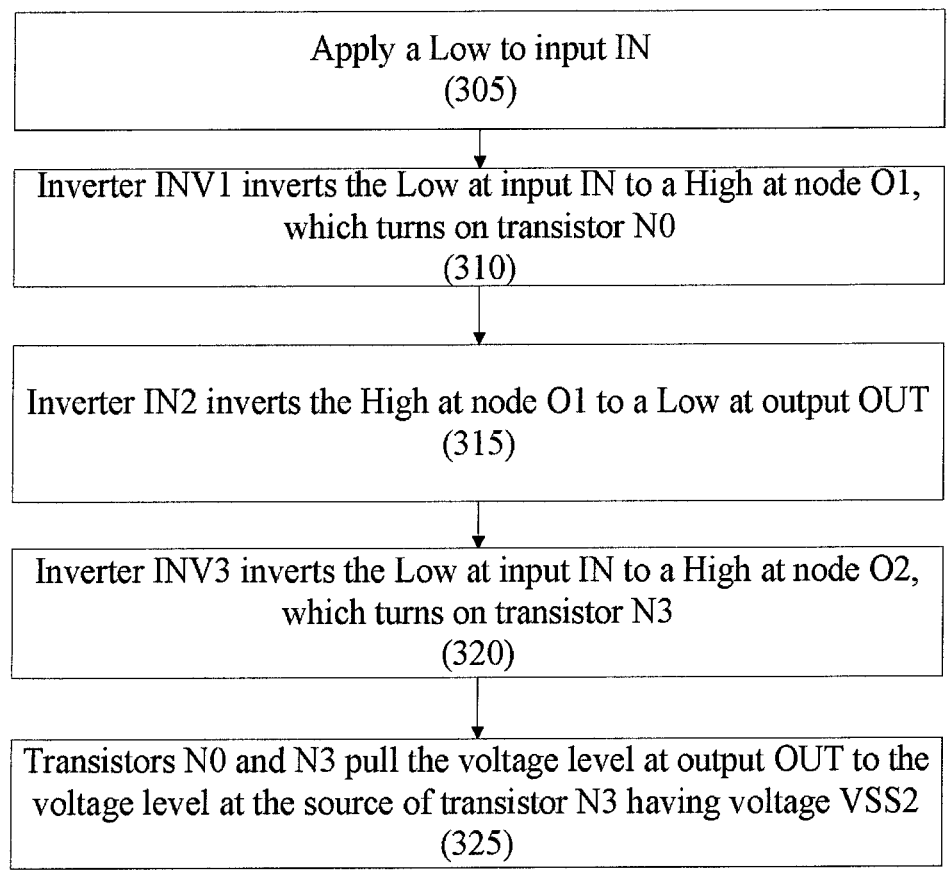
FIG. 3 is a flowchart illustrating the operation of the voltage level shifter in FIG. 1 when the input of the voltage level shifter receives a low logic level, in accordance with some embodiments.

FIG. 3 is a flowchart 300, illustrating the operation of voltage level shifter 100, when input IN receives a Low.

In step 305, a Low is applied at input IN.

In step 310, inverter INV1 inverts the Low at input IN to a High at node O1, which turns on transistor N0.

In step 315, inverter INV2 inverts the High at node O1 to a Low at output OUT.

In step 320, inverter INV3 inverts the Low at input IN to a High at node O2, which turns on transistor N3.

In step 325, transistors N0 and N3 pull the voltage level at output OUT to the voltage level at the source of transistor N3 having voltage VSS2, which is −0.5 V. In effect, output OUT has voltage VSS2 or −0.5 V.

Exemplary Operation with the Input Receiving a High Logic Level

Figure 4:
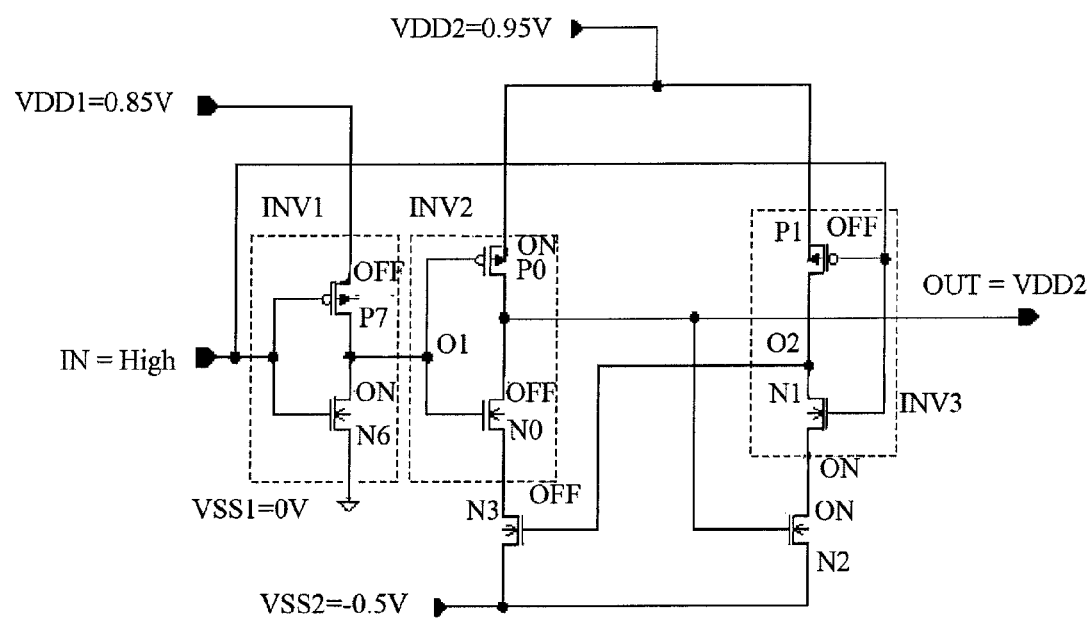
FIG. 4 is a diagram of the voltage level shifter in FIG. 1 having the operational state of each transistor labeled when the input of the voltage level shifter receives a high logic level, in accordance with some embodiments.

FIG. 4 is a diagram 400 of voltage level shifter 100 having the operational state of each transistor labeled, illustrating an operation of voltage level shifter 100 when a High is applied to input IN, in accordance with some embodiments. As illustratively shown, transistors N6, P0, N1, and N2 are on while transistors P7, N0, N3, and P1 are off. Further, voltages VSS1, VDD1, VSS2, and VDD2 are set at 0.0 V, 0.85 V, and −0.5 V, and 0.95 V, respectively. In some embodiments, when input IN is High, the voltage level of output OUT follows the voltage level specified at node VDD2, which, for illustration, is 0.95 V.

Because input IN is High, NMOS transistor N6 is on while PMOS transistor P7 is off. Node O1, which is the drain of NMOS transistor N6, is pulled to the voltage level at the source of NMOS transistor N6, which is Low at the voltage value of voltage VSS1 (e.g., 0 V). Stated another way, because input IN of inverter INV1 is High, output O1, the output of inverter INV1, is Low, which also turns on PMOS transistor P0, and turns off NMOS transistor N0. Because transistor P0 is on, output OUT, which is the drain of transistor P0, is pulled to the source of transistor P0, which is High (e.g., VDD2 or 0.95 V). Because output OUT is also the gate of transistor N2, which is High, transistor N2 is on.

Because input IN is High, the gates of PMOS transistor P1 and NMOS transistor N1 are High. As a result, transistor P1 and N1 are off and on, respectively. Because transistor N1 is on, node O2, which is the drain of transistor N1, is pulled to the voltage level at its source, which is the drain of transistor N2. Because NMOS transistor N2 is on, the voltage level at its drain is pulled to the voltage level at its source, which is voltage VSS2 or Low. As a result, node O2 is Low. Because node O2 is also the gate of transistor N3, which is Low, transistor N3 turns off. Because NMOS transistors N0 and N3 are off, node of voltage VSS2 is electrically disconnected from output OUT.

Figure 5:
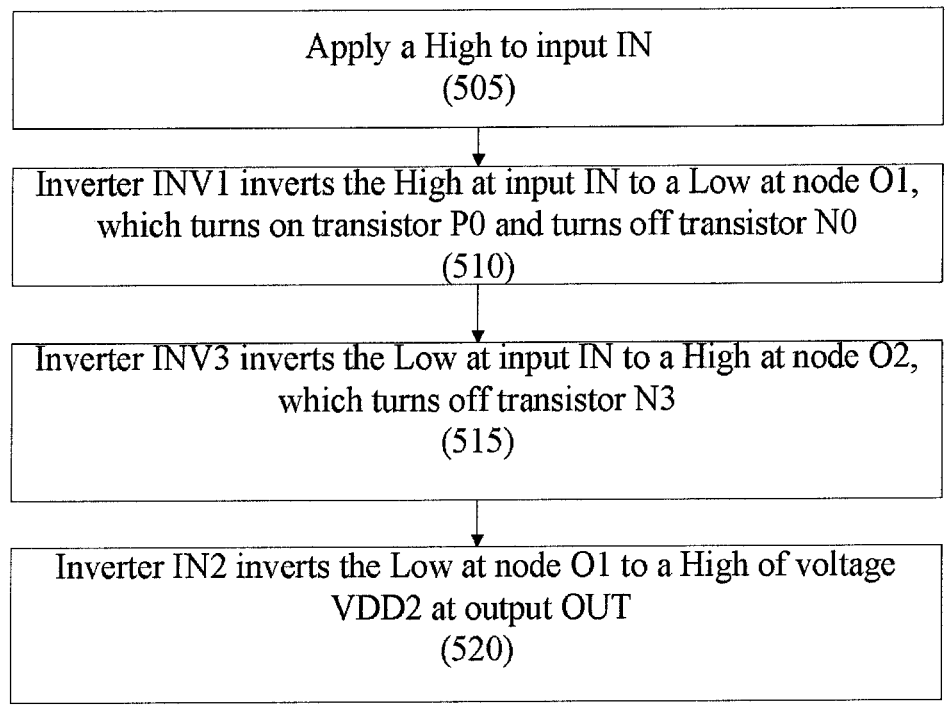
FIG. 5 is a flowchart illustrating the operation of the voltage level shifter in FIG. 1 when the input of the voltage level shifter receives a high logic level, in accordance with some embodiments.

FIG. 5 is a flowchart 500, illustrating the operation of voltage level shifter 100, when input IN receives a High.

In step 505, a High is applied at input IN.

In step 510, inverter INV1 inverts the High at input IN to a Low at node O1, which turns off transistor N0.

In step 515, inverter INV3 inverts the High at input IN to a Low at node O2, which turns off transistor N3. Because transistors N0 and N3 are off, node of voltage VSS2 is electrically disconnected from output OUT.

In step 520, inverter INV2 inverts the Low at node O1 to a High of voltage VDD2 at output OUT. Explained another way, the Low at output O1 also turns on transistor P0, which pulls the voltage level at output OUT (e.g., the drain of transistor P0) to the voltage level at the source of transistor P0 having voltage VDD2. In effect, output OUT has voltage VDD2 or 0.95 V.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., low or high) of the various signals used in the above description is also for illustration purposes, embodiments are not limited to a particular level when a signal is activated and/or deactivated, but, rather, selecting such a level is a matter of design choice.

For another example, in some embodiments, when input IN is Low, output OUT follows voltage VSS2, and when input IN is High, output OUT follows voltage VDD2.

For another example, some embodiments regard a circuit comprising: a first inverter, a second inverter, a third inverter, and a first NMOS transistor. An input of the first inverter is configured to serve as an input node. An output of the first inverter is coupled to an input of the second inverter. An output of the second inverter is configured to serve as an output node. An input of the third inverter is coupled to an input of the first inverter. A gate of the first NMOS transistor is coupled to an output of the third inverter. A drain of the first NMOS transistor is coupled to the second inverter. A source of the first NMOS transistor is configured to serve as an input level node. When the input node is configured to receive a low logic level, the output node is configured to receive a voltage level provided by a voltage level at the level input node.

For another example, some embodiments regard a circuit comprising: a first PMOS transistor having a first P gate, a first P drain, and a first P source; a first NMOS transistor having a first N gate, a first N drain, and a first N source; a second PMOS transistor having a second P gate, a second P drain, and a second P source; a second NMOS transistor having a second N gate, a second N drain, and a second N source; a third PMOS transistor having a third P gate, a third P drain, and a third P source; a third NMOS transistor having a third N gate, a third N drain, and a third N source; a fourth NMOS transistor having a fourth N gate, a fourth N drain, and a fourth N source; a fifth NMOS transistor having a fifth N gate, a fifth N drain, and a fifth N source; an input node; an output node; a first level input node; and a second level input node. The input node is coupled to the first P gate, the first N gate, the third P gate, and the third N gate. The first P drain is coupled to the first N drain, the second P gate, and the second N gate. The second P drain is coupled to the second N drain, the fifth N gate, and the output node. The second P source is coupled to the third P source and the second input level node. The second N source is coupled to the fourth N drain. The fourth N gate is coupled to third N drain and the third P drain. The fourth N source is coupled to the fifth N source and the first level input node. The third N source is coupled to the fifth N drain. When the input node is configured to receive a low logic level the output node is configured to receive a first voltage value provided by the first level input node, and when the input node is configured to receive a high logic level the output node is configured to receive a second voltage value provided by the second level input node.

For another example, some embodiments regard a method comprising: using a first inverter to invert a first high logic level to a first low logic level; using a second inverter to invert the first low logic level to a second high logic level; a voltage value of the second high logic level provided by a PMOS transistor of the second inverter; and using a third inverter to invert the first high logic level to a second low logic level to turn off a first NMOS transistor coupled to a second NMOS transistor of the second inverter; the second high logic level configured to turn on a third NMOS transistor coupled to a fourth NMOS transistor of the third inverter.

For another example, some embodiments regard a method comprising: using a first inverter to invert a first low logic level to a first high logic level; using a second inverter to invert the first high logic level to a second low logic level; the second inverter having a first PMOS transistor coupled in series with a first NMOS transistor; a drain of the first NMOS transistor configured to provide the second low logic level; and using a second NMOS transistor coupled in series with the first NMOS transistor to provide a voltage value at a source of the second NMOS transistor coupled to the drain of the first NMOS transistor.

The above methods show exemplary steps, but they are not necessarily performed in the order shown, and some steps may be performed concurrently. Steps may be added, replaced, changed order, and/or eliminated as appropriate, in accordance with the spirit and scope of disclosed embodiments.

What is claimed is:

1. A circuit comprising:
   a first inverter, an input of the first inverter configured to serve as an input node;
   a second inverter, an output of the first inverter coupled to an input of the second inverter; an output of the second inverter configured to serve as an output node;
   a third inverter, an input of the third inverter coupled to the input of the first inverter; and
   a first NMOS transistor, a gate of the first NMOS transistor coupled to an output of the third inverter; a drain of the first NMOS transistor coupled to the second inverter; a source of the first NMOS transistor configured to serve as an input level node,
   wherein when the input node is configured to receive a low logic level, the output node is configured to receive a voltage value provided by a voltage value at the level input node, and
   wherein the second inverter includes
      a PMOS transistor having a PMOS source, a PMOS drain, and a PMOS gate; and
      a second NMOS transistor having a second NMOS drain, a second NMOS source, and a second NMOS gate; and
      the second NMOS source directly coupled to the drain of the first NMOS transistor.

2. The circuit of claim 1 further comprising a third NMOS transistor, a gate of the third NMOS transistor coupled to the output node, a drain of the third NMOS transistor coupled to the third inverter, and a source of the third NMOS transistor coupled to the source of the first NMOS transistor.

3. The circuit of claim 1, wherein:
   the PMOS gate is coupled to the second NMOS gate and configured to serve as the input of the second inverter;
   the PMOS source is coupled to a supply voltage source; and
   the PMOS drain is coupled to the second NMOS drain and configured to serve as the output node.

4. The circuit of claim 3, wherein when the input node is configured to receive a high logic level, the output node is configured to receive a voltage value provided by the supply voltage source.

5. The circuit of claim 1, wherein:
   the second inverter is configured to receive a second inverter power supply from a second inverter power supply source; and
   when the input node is configured to receive a high logic level, the output node is configured to receive a voltage value provided by the second inverter power supply source.

6. The circuit of claim 5, wherein the first inverter is configured to receive a first inverter power supply from a first inverter power supply source that is the same as the second inverter power supply source.

7. The circuit of claim 5, wherein the first inverter is configured to receive a first inverter power supply from a first inverter power supply source different from the second inverter power supply source.

8. The circuit of claim 1 further comprising:
a first voltage supply source providing a first supply voltage;
a second voltage supply source providing a second supply voltage;
a first ground reference source providing a first ground reference voltage; and
a second ground reference source generating a second ground reference voltage,
wherein the first voltage supply source and the first ground reference source are used by the first inverter, the second voltage supply source is used by the second inverter, and the second ground reference source is coupled to the source of the first NMOS transistor.

9. The circuit of claim 8, wherein the first voltage supply source, the second voltage supply source, the first ground reference source, and the second ground reference source are configured to satisfy at least one of the following conditions:

$$VDD1 > Vtn1 + VSS1;$$

$$VDD2 > Vtn2 + VSS2;$$

$$VDD1 > Vtn2 + VSS2; \text{ and}$$

$$VDD1 > VDD2 - |Vtp2|,$$

wherein VDD1 represents the first supply voltage, VDD2 represents the second supply voltage, VSS1 represents the first ground reference, VSS2 represents the second ground reference, Vtn1 represents a threshold voltage of an NMOS transistor of the first inverter, Vtn2 represents a threshold voltage of NMOS transistors in the second and the third inverters and of the first NMOS transistor, and Vtp2 represents a threshold voltage of PMOS transistors in the second and the third inverters.

10. A circuit comprising:
a first PMOS transistor having a first P gate, a first P drain, and a first P source;
a first NMOS transistor having a first N gate, a first N drain, and a first N source;
a second PMOS transistor having a second P gate, a second P drain, and a second P source;
a second NMOS transistor having a second N gate, a second N drain, and a second N source;
a third PMOS transistor having a third P gate, a third P drain, and a third P source;
a third NMOS transistor having a third N gate, a third N drain, and a third N source;
a fourth NMOS transistor having a fourth N gate, a fourth N drain, and a fourth N source;
a fifth NMOS transistor having a fifth N gate, a fifth N drain, and a fifth N source;
an input node;
an output node;
a first level input node; and
a second level input node, wherein
the input node coupled to the first P gate, the first N gate, the third P gate, and the third N gate;
the first P drain coupled to the first N drain, the second P gate, and the second N gate;
the second P drain coupled to the second N drain, the fifth N gate, and the output node;
the second P source coupled to the third P source and the second input level node;
the second N source coupled to the fourth N drain;
the fourth N gate coupled to third N drain and the third P drain;
the fourth N source coupled to the fifth N source and the first level input node;
the third N source coupled to the fifth N drain; and
when the input node is configured to receive a low logic level, the output node is configured to receive a first voltage value provided by the first level input node, and, when the input node is configured to receive a high logic level, the output node is configured to receive a second voltage value provided by the second level input node.

11. The circuit of claim 10, wherein the second P source is coupled to a voltage supply source and to the second level input node.

12. The circuit of claim 10, wherein a first voltage at the first P source is provided by a first voltage supply source different from a second voltage supply source coupled to the second P source and providing a second voltage to the second level input node.

13. The circuit of claim 10, wherein the first N source is coupled to a first ground reference source different from a second ground reference source coupled to the fourth N source and the fifth N source.

14. The circuit of claim 10, wherein the first N source is coupled to a ground reference source, the fourth N source, and the fifth N source.

15. The circuit of claim 10 further comprising a voltage supply source coupled to the first P source and providing a supply voltage value, a ground reference source coupled to the first N source and providing a ground reference value, wherein the voltage supply source, the second level input node, the ground reference source, and the first level input node are configured to satisfy at least one of the following conditions:

$$VDD1 > Vtn1 + VSS1;$$

$$VDD2 > Vtn2 + VSS2;$$

$$VDD1 > Vtn2 + VSS2; \text{ and}$$

$$VDD1 > VDD2 - |Vtp2|,$$

wherein VDD1 represents the supply voltage value, VDD2 represents the second voltage value, VSS1 represents the ground reference value, VSS2 represents the voltage value, Vtn1 represents a threshold voltage of the first NMOS transistor, Vtn2 represents a threshold voltage of the second, the third, the fourth and the fifth NMOS transistors, and Vtp2 represents a threshold voltage of the second and the third PMOS transistors.

16. A method comprising:
inverting a first low logic level to a first high logic level utilizing a first inverter;
inverting the first high logic level to a second low logic level utilizing a second inverter, the second inverter having a first PMOS transistor coupled in series with a first NMOS transistor, a drain of the first NMOS transistor configured to provide the second low logic level; and
providing a voltage value at a source of a second NMOS transistor to the drain of the first NMOS transistor utilizing the second NMOS transistor, a drain of the second NMOS transistor directly coupled in series with a source of the first NMOS transistor.

17. The method of claim 16 further comprising turning on the second NMOS transistor by a second high logic level converted from the first low logic level by a third inverter.

18. The method of claim 17 further comprising turning off a third NMOS transistor coupled in series with a fourth NMOS transistor of the third inverter utilizing the second low logic level, a drain of the third NMOS transistor directly coupled with a source of the fourth NMOS transistor.

19. The method of claim 18, wherein the source of the second NMOS transistor is coupled to a source of the third NMOS transistor.

20. A method comprising:
   inverting a first high logic level to a first low logic level utilizing a first inverter;
   inverting the first low logic level to a second high logic level utilizing a second inverter, a voltage value of the second high logic level provided by a PMOS transistor of the second inverter; and
   inverting the first high logic level to a second low logic level utilizing a third inverter in order to turn off a first NMOS transistor, a drain of the first NMOS transistor directly coupled to a source of a second NMOS transistor of the second inverter, the second high logic level configured to turn on a third NMOS transistor coupled to a fourth NMOS transistor of the third inverter.

21. The circuit of claim 10, wherein the second N source is coupled to the fourth N drain at all times.

\* \* \* \* \*